United States Patent
Mita et al.

(10) Patent No.: US 8,304,856 B2
(45) Date of Patent: Nov. 6, 2012

(54) SEMICONDUCTOR DEVICE

(75) Inventors: Keiji Mita, Isesaki (JP); Yasuhiro Tamada, Ota (JP); Masao Takahashi, Fukaya (JP); Takao Maruyama, Ora-gun (JP)

(73) Assignees: Sanyo Semiconductor Co., Ltd., Gunma (JP); Sanyo Semiconductor Manufacturing Co., Ltd., Ojiya-shi (JP); Semiconductor Components Industries, LLC, Phoenix ( * ) Notice: Subject to any disclaimer, the term of this patent is extended or adjusted under 35 U.S.C. 154(b) by 241 days.

(21) Appl. No.: 12/880,764

(22) Filed: Sep. 13, 2010

(65) Prior Publication Data

US 2011/0079880 A1 Apr. 7, 2011

(30) Foreign Application Priority Data

Oct. 2, 2009 (JP) .................................. 2009-230466

(51) Int. Cl.
*H01L 27/02* (2006.01)

(52) U.S. Cl. ........ 257/546; 257/355; 257/551; 257/601; 257/E21.358; 257/E21.361; 257/E25.002; 257/E27.049; 257/E27.051; 257/E27.073; 257/E29.327; 438/328

(58) Field of Classification Search .................. 257/342, 257/355, 546, 551, 601, E21.358, E21.361, 257/E25.002, E27.049, E27.051, E27.073, 257/E29.327; 438/328
See application file for complete search history.

(56) References Cited

U.S. PATENT DOCUMENTS

| | | | | |
|---|---|---|---|---|
| 5,432,368 A | * | 7/1995 | Jimenez | 257/355 |
| 5,545,909 A | * | 8/1996 | Williams et al. | 257/355 |
| 5,708,289 A | * | 1/1998 | Blanchard | 257/355 |

FOREIGN PATENT DOCUMENTS

| | | |
|---|---|---|
| JP | 2006-100308 | 4/2006 |
| JP | 2006-237210 | 9/2006 |

* cited by examiner

*Primary Examiner* — Matthew E Warren
*Assistant Examiner* — John Lin
(74) *Attorney, Agent, or Firm* — Morrison & Foerster LLP

(57) ABSTRACT

A serially-connected diode pair made of diodes having a high withstand voltage and a low on-resistance is formed based on a high withstand voltage vertical PNP bipolar transistor process technology. Two of the diode pairs are connected in parallel to form a bridge so that there is formed a high-efficiency full-wave rectifier circuit that is free from a leakage current due to a parasitic transistor. The serially-connected diode pair is formed by connecting a diode composed of a P type semiconductor substrate, that makes an anode, and an N type buried layer, that makes a cathode, and a diode composed of a P+ type conductive layer, that makes an anode, and an N type epitaxial layer, that makes a cathode, in series with an electrode AC1. An N+ type buried layer and an N+ type conductive layer are formed to prevent an electric potential at the N+ type buried layer from becoming lower than an electric potential at a P+ type buried layer even when a large positive voltage is applied to the electrode AC1, so as to prevent a parasitic PNP transistor composed of the P+ type buried layer, the N+ type buried layer and the P type semiconductor substrate, that make an emitter, a base and a collector, respectively, from turning on.

8 Claims, 5 Drawing Sheets

SEMICONDUCTOR DEVICE

CROSS-REFERENCE OF THE INVENTION

This application claims priority from Japanese Patent Application No. 2009-230466, the content of which is incorporated herein by reference in its entirety.

BACKGROUND OF THE INVENTION

1. Field of the Invention

This invention relates to a semiconductor device related to a full-wave rectifier circuit having a structure of a bridge composed of four diodes, specifically to a semiconductor device related to a full-wave rectifier circuit composed of high withstand voltage diodes.

2. Description of the Related Art

The full-wave rectifier circuit having a structure of a bridge composed of four diodes has been formed of a combination of low-price discrete diodes. However, it becomes necessary that the four diodes or the four diodes and related integrated circuit are formed in a single semiconductor die, in order to meet requirements such as overall size reduction of a product such as a portable device. In this case, careful consideration is required to integrate the diodes of high withstand voltage and high current in the single semiconductor die. For example, Japanese Patent Application Publication No. 2006-237210 discloses a method to prevent a junction breakdown in a portion of a semiconductor substrate which is outside a region where the bridge circuit is formed. According to the patent document, there is formed in the semiconductor die only the bridge circuit made of diodes formed side by side from both surfaces of the semiconductor die.

That is, two columns of a serially-connected pair of diodes are connected in parallel between two DC voltage output terminals in the bridge of a full-wave rectifier circuit. Therefore, a withstand voltage between the DC voltage output terminals of the semiconductor region other than the region in which the diodes are formed is required to be higher than twice a reverse breakdown voltage of the diode. Thus, three serially-connected diodes are formed in the semiconductor substrate and connected parallel to the serially-connected pair of diodes between the DC voltage output terminals. With that, there is disclosed the method to prevent the junction breakdown from occurring in the portion outside the region where the bridge circuit is formed by making the withstand voltage of the portion other than the region in which the serially-connected pairs of diodes are formed higher than the withstand voltage of the serially-connected pair of diodes.

Also, Japanese Patent Application Publication No. 2006-100308 discloses an example to form a full-wave rectifier circuit by forming diodes from only one of principal surfaces of a semiconductor die. An RF circuit, a memory circuit, a logic circuit and the like are incorporated in the semiconductor die. In this case, there is caused a problem that a parasitic transistor is fowled between elements that form the diodes. A countermeasure against the problem is disclosed.

That is, the Japanese Patent Application Publication No. 2006-237210 discloses only the full-wave rectifier circuit in which the four diodes are formed side by side from both surfaces of the semiconductor substrate to penetrate through the semiconductor substrate and connected to compose the bridge as described above. The Japanese Patent Application Publication No. 2006-100308 discloses the full-wave rectifier circuit made of the bridge circuit by forming the four diodes in only one of the principal surfaces of a P type semiconductor substrate.

SUMMARY OF THE INVENTION

The invention provides a semiconductor device that includes a semiconductor substrate of a first general conductivity type, an epitaxial layer of a second general conductivity type formed on the semiconductor substrate, a first buried layer of the second general conductivity type buried in the semiconductor substrate, a second buried layer of the second general conductivity type buried in the first buried layer and having a higher impurity concentration than the first buried layer, a third buried layer of the first general conductivity type buried in the second buried layer and the epitaxial layer, a first conductive layer of the first general conductivity type formed in a first portion of the epitaxial layer so as to be on a peripheral portion of the third buried layer, and an isolation layer of the first general conductivity type formed in the epitaxial layer so as to isolate the first portion of the epitaxial layer and the third buried layer from other portions of the epitaxial layer. The semiconductor substrate and the first buried layer are configured to operate as a first diode so that the semiconductor substrate works as an anode and the first buried layer works as a cathode. The first conductivity layer and the epitaxial layer are configured to operate as a second diode so that the first conductive layer works as an anode and the epitaxial layer works as a cathode. The first diode and the second diode are connected serially.

DETAILED DESCRIPTION OF THE INVENTION

A full-wave rectifier circuit according to an embodiment of this invention is made of a bridge circuit composed of four diodes formed utilizing a P type semiconductor substrate, a P+ type diffusion layer that makes a collector of a high withstand voltage vertical PNP transistor often used in a bipolar LSI, an N type epitaxial layer and an N+ type diffusion layer that make its base, and an N type layer that makes its buried layer. However, when the full-wave rectifier circuit is formed of a structure of the high withstand voltage vertical PNP transistor as it is, there arises a problem that a leakage current is caused by a parasitic transistor. Thus, before explaining the embodiment of this invention, a reference example is hereafter described to explain the problem that arises in the case where the diodes are formed of the structure of the high withstand voltage vertical PNP transistor as it is.

Figure 2:
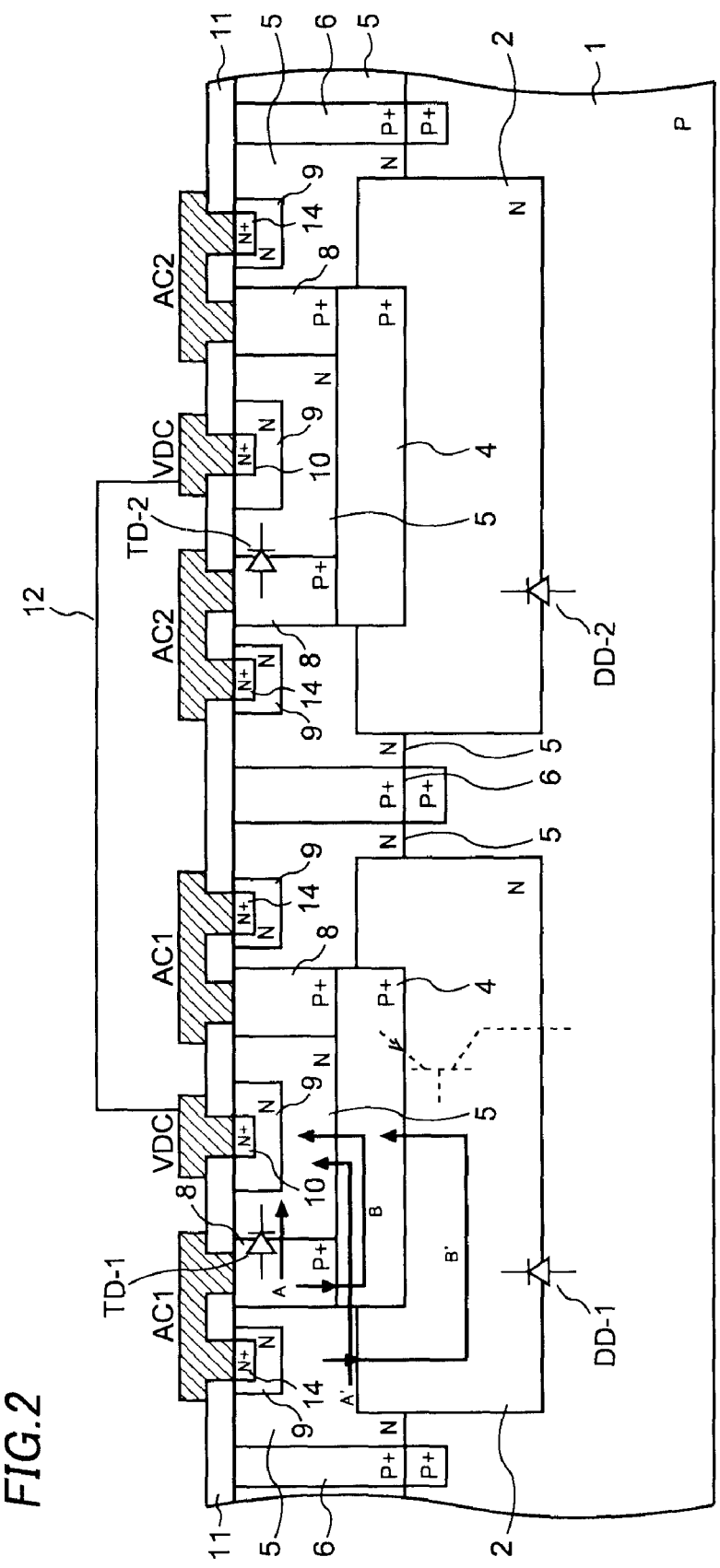
FIG. 2 is a cross-sectional view of a semiconductor device according to a reference example.

A structure of the semiconductor device according to the reference example and its problem will be explained referring to FIG. 2. Two identically structured diode forming regions surrounded by two P+ type isolation layers 6 are shown in FIG. 2. First, a structure of the left region interposed between the two P+ type isolation layers 6 in FIG. 2 will be explained. An N type buried layer 2 of low impurity concentration is formed in a P type semiconductor substrate 1 in order to secure a high withstand voltage. A P+ type buried layer 4 is formed on the N type buried layer 2 to be in contact with it. A P+ type conductive layer 8 (a P+ type semiconductor layer) is formed on each of both ends of the P+ type buried layer 4 to be in contact with it. An epitaxial layer 5 is formed on the P type semiconductor substrate 1 by epitaxial growth. The epitaxial layer 5 on the P+ type buried layer 4 is formed to touch the P+ type buried layer 4. When looked from a direction perpendicular to the P type semiconductor substrate 1, a portion of the N type epitaxial layer 5 on the P+ type buried layer 4 is surrounded by the P+ type conductive layer 8. The P+ type conductive layer 8 extends to a surface of the N type epitaxial layer 5 on the P+ type buried layer 4.

Conductivity types such as P+, P and P− belong to one general conductivity type, and conductivity types such as N+, N and N− belong to the other general conductivity type.

An N type well layer 9 is formed in the surface of the N type epitaxial layer 5 surrounded by the P+ type conductive layer 8, and an N+ type contact layer 10 is formed in a surface of the N type well layer 9. At the same time, another N type well layer 9 and another N+ type contact layer 14 are formed in a surface of the N type epitaxial layer 5 interposed between the P+ type conductive layer 8 and the P+ type isolation layer 6. Also, an electrode VDC that is electrically connected to the N+ type contact layer 10 is formed on the N+contact layer 10 in the N type well layer 9. At the same time, there is formed an electrode AC1 that connects between the P+ type conductive layer 8 and the N+ type contact layer 14 in the N type epitaxial layer 5 interposed between the P+ type conductive layer 8 and the P+ type isolation layer 6.

The same structure as described above is also formed in the N type epitaxial layer 5 interposed between two P+ type isolation layers 6 in the right region shown in FIG. 2. The electrode VDC in the left region and the electrode VDC in the right region are connected with each other through a VDC wiring 12, and both regions share the P type semiconductor substrate 1 that connects between them. The VDC wiring 12 is formed on an interlayer insulation film (not shown).

Figure 3:
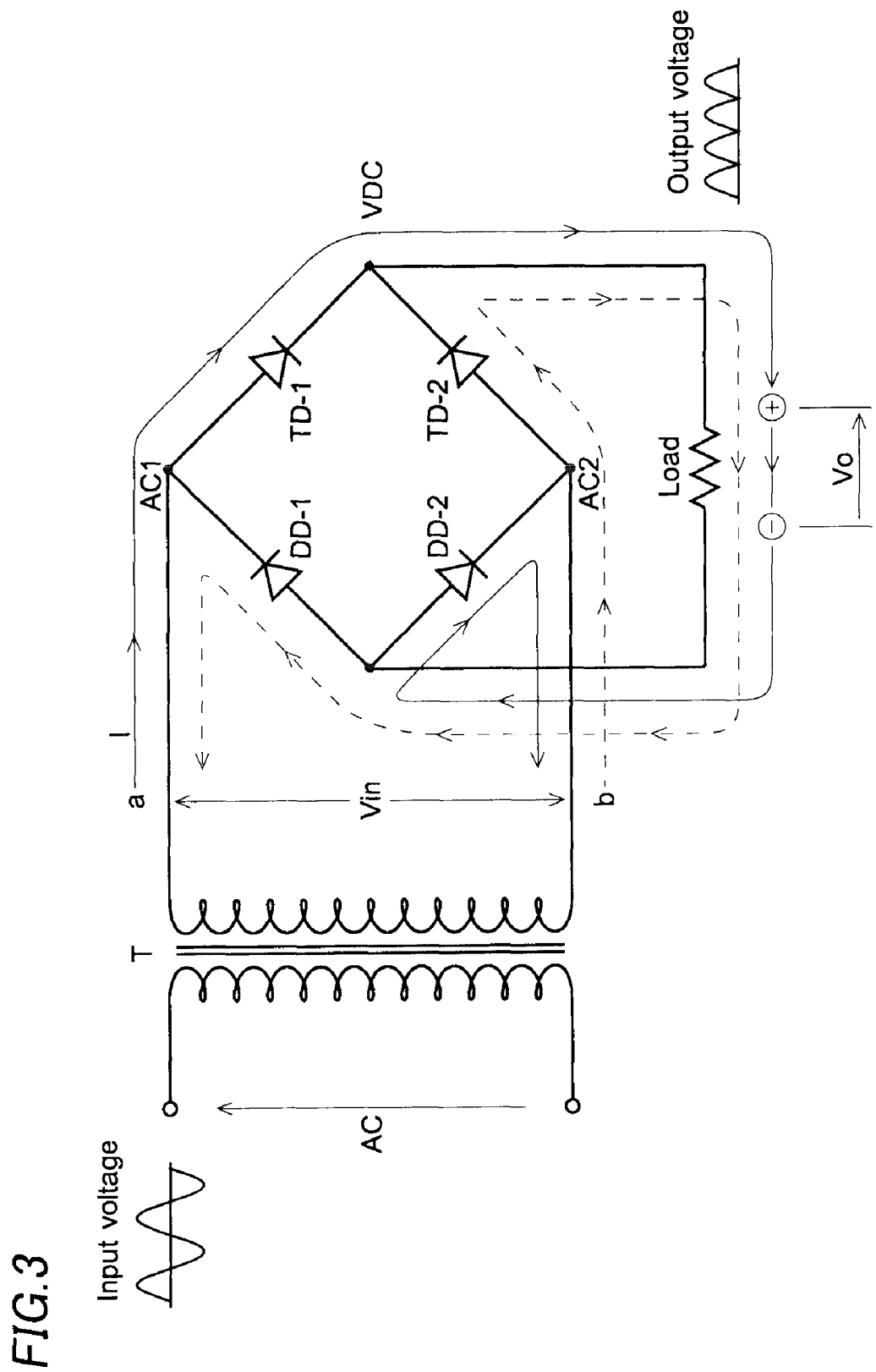
FIG. 3 shows an operation of a full-wave rectifier circuit made of a bridge circuit composed of four diodes.

FIG. 3 shows a full-wave rectifier circuit in which four diodes are connected to form a bridge. That is, a diode DD-1 and a diode TD-1 are connected in series, while a diode DD-2 and a diode TD-2 are connected in series. Two serially-connected pairs of the diodes are connected in parallel to form the bridge and compose the full-wave rectifier circuit. Lines connecting the diodes with each other in FIG. 3 correspond to regions that electrically connect between the diodes composing the full-wave rectifier circuit shown in FIG. 2. Symbols representing the four diodes in FIG. 3 are shown in FIG. 2. Locations and connections of the diodes will be explained hereafter.

The diode DD-1 is formed of the P type semiconductor substrate 1, which serves as an anode, and the N type buried layer 2, which serves as a cathode. The N type buried layer 2, which is the cathode, is electrically connected to the N+ type contact layer 14 through the overlying N type epitaxial layer 5 and the N type well layer 9. The N+ type contact layer 14 is electrically connected to the P+ type conductive layer 8, which makes an anode of the diode TD-1, through the electrode AC 1. A cathode of the diode TD-1 is made of a region extending from the N type epitaxial layer 5 adjacent the P+ type conductive layer 8, which makes the anode, via the N type well layer 9 to the N+ type contact layer 10.

The electrode VDC is connected to the N+contact layer 10, which makes the cathode. The electrode VDC in the left region is electrically connected with the electrode VDC in the right region through the VDC wiring 12. The electrode VDC in the right region is electrically connected with the underlying N+ type contact layer 10. The N+ type contact layer 10, the N type well layer 9 and the N type epitaxial layer 5 extending to the P+ type conductive layer 8 make a cathode of the diode TD-2. The P+ type conductive layer 8 adjacent the N type epitaxial layer 5, which is the cathode, makes an anode of the diode TD-2. The P+ type conductive layer 8, which is the anode of the diode TD-2, is connected with the electrode AC2 and electrically connected with the adjacent N+ type contact layer 14, as shown in FIG. 2.

The N+ type contact layer 14 is electrically connected with the N type buried layer 2, which makes a cathode of the diode DD-2, through the N type well layer 9 and the N type epitaxial layer 5. The P type semiconductor substrate 1 adjacent the N type buried layer 2, which makes the cathode, makes an anode of the diode DD-2. The anode of the diode DD-1 and the anode of the diode DD-2 are both made of the P type semiconductor substrate 1, and electrically connected with each other. Thus, the bridge of the full-wave rectifier circuit composed of the diodes as shown in FIG. 3 is realized with the P type semiconductor substrate 1, the N type buried layer 2, the P+ type conductive layer 8 and the N type epitaxial layer 5 as shown in FIG. 2.

Problems with the semiconductor device according to the reference example are hereafter explained in detail. There is considered a case in which an input voltage of +140 V, for example, is applied to the electrode AC1 in the right region in FIG. 2, while 0 V is applied to the electrode AC2 in the left region in FIG. 2. When the case is described referring to FIG. 3, +140 V is applied to an AC voltage input terminal AC1 of the bridge circuit, while 0 V is applied to another AC voltage input terminal AC2. In this case, a diode current I indicated by a solid line flows from the terminal AC1, to which +140 V is applied, to the terminal AC2, to which 0 V is applied, through the forward-biased diode TD-1, a load and the forward-biased diode DD-2, as shown in FIG. 3.

When it is described referring to FIG. 2, +140 V is applied to the electrode AC1, and a forward current flows from the P+ type conductive layer 8, which makes the anode of the forward-biased diode TD-1, to the N+ type contact layer 10 through the N type epitaxial layer 5 and the N type well layer 9, which make the cathode of the diode TD-1. The current flows into the P type semiconductor substrate 1, which makes the anode of the forward-biased diode DD-2, through the load (not shown in FIG. 2) connected to the electrode VDC, and further flows to the N type buried layer 2, which makes the cathode of the diode DD-2. After that, the diode current flows through the N type epitaxial layer 5 adjacent the N type buried layer 2, the N type well layer 9 and the N+ type contact layer 14, and flows to the electrode AC2, to which 0 V is applied. Following problems are caused in this case.

When the forward voltage of +140 V is applied to the diode TD-1, the forward current flows from the P+ type conductive layer 8, which makes the anode, to the N type epitaxial layer 5, which makes the cathode, through two major current paths, that are a path indicated by an arrow A and a path indicated by an arrow B in FIG. 2. Although majority of the current flows through the path indicated by the arrow A that is a shorter path to the N+ type contact layer 10, which makes the cathode, there is some component of the current flowing through the path indicated by the arrow B, which flows from the P+ type conductive layer 8 to the N type epitaxial layer 5 via the P+ type buried layer 4.

An electric potential at the electrode VDC becomes about +138 V because of a voltage drop in the cathode region of the diode TD-1 due to a parasitic resistance in the cathode region in addition to a voltage drop of about 0.7 V across a PN junction. On the other hand, an electric potential at the P+ type buried layer 4 becomes about +139 V, that is slightly lower than the input electric potential +140 V at the electrode AC1, because there is a voltage drop due to the current through the path indicated by the arrow B, which flows through the P+ type conductive layer 8, which is of relatively high impurity density, to the P+ type buried layer 4, which is also of relatively high impurity density. Since the P+ type conductive layer 8 and the N+ type contact layer 14 in its outside are electrically connected with the electrode AC1 as shown in FIG. 2, an electric potential at the N+ type contact layer 14 and the N type well layer 9 and the N type epitaxial layer 5 adjacent to it is +140 V. Note that the diode current of the rectifier according to the embodiment of this invention is approximately 10-100 mA.

In this case, since the electric potential at the P+ type buried layer 4 of +139 V is higher than the electric potential at the N+contact layer 10 of +138 V, a parasitic NPN transistor, that is composed of an emitter made of the N+ type contact layer 10, a base made of the P+ type buried layer 4 and a collector made of the N+ type contact layer 14, is turned on. Then, an on-current of the parasitic NPN transistor flows from the N+ type contact layer 14, that makes the collector, to the N+ type contact layer 10, that makes the emitter, through the P+ type buried layer 4, that makes the base.

The on-current flows through two major paths, that are a path indicated by an arrow A' and a path indicated by an arrow B' as shown in FIG. 2, as in the case of the diode current described above. Since the path indicated by the arrow A' is made of the P+ type buried layer 4 and the like having relatively high impurity concentration, a voltage drop across it is so small that an electric potential at the P+ type buried layer 4 becomes about +138 V. On the other hand, since the path indicated by the arrow B' is made of the N type buried layer 2 having relatively low impurity concentration, a voltage drop across it becomes inevitably larger than the voltage drop across the path indicated by the arrow A', so that there is a case in which an electric potential at the N type buried layer 2 is reduced to about +135 V.

There exists a parasitic PNP transistor composed of an emitter made of the P+ type buried layer 4, a base made of the N type buried layer 2 and a collector made of the P type semiconductor substrate 1, as depicted by dashed lines in FIG. 2. Since +138 V of the electric potential at the P+ type buried layer 4, that makes the emitter of the parasitic PNP transistor, is higher than +135 V of the electric potential at the N type buried layer 2, that makes the base, under the electric potential distribution described above, an on-current of the parasitic PNP transistor flows from the P+ type buried layer 4, that makes the emitter, toward the P type semiconductor substrate 1, that makes the collector and is at the electric potential of nearly 0 V, through the N type buried layer 2, that makes the base.

As a result, there is caused a problem that a power efficiency of the full-wave rectifier circuit is reduced since a part of the current flowing from the electrode AC1, which makes the input terminal, into the full-wave rectifier circuit leaks to the P type semiconductor substrate 1, so that not all the current does not contribute for forming an output voltage. The case where +140 V is applied to the electrode AC1 and 0 V is applied to the electrode AC2 is explained as described above. In the case where +140 V is applied to the electrode AC2 and 0 V is applied to the electrode AC1, what have happened to TD-1 and DD-1 happen to TD-2 and DD-2 as well, and the leakage current is caused from the electrode AC2 to the P type semiconductor substrate 1 to reduce the power efficiency of the full-wave rectifier circuit.

This invention is directed to improve the power efficiency of the full-wave rectifier circuit by preventing the leakage current, which is the on-current of the parasitic PNP transistor in the reference example, from flowing from the electrode AC1 or the electrode AC2, which is the AC voltage input terminal, toward the P type semiconductor substrate 1. A semiconductor device according to an embodiment of this invention will be explained in detail referring to FIG. 1. The same components as in the semiconductor device according to the reference example shown in FIG. 2 are denoted by the same symbols.

Figure 1:
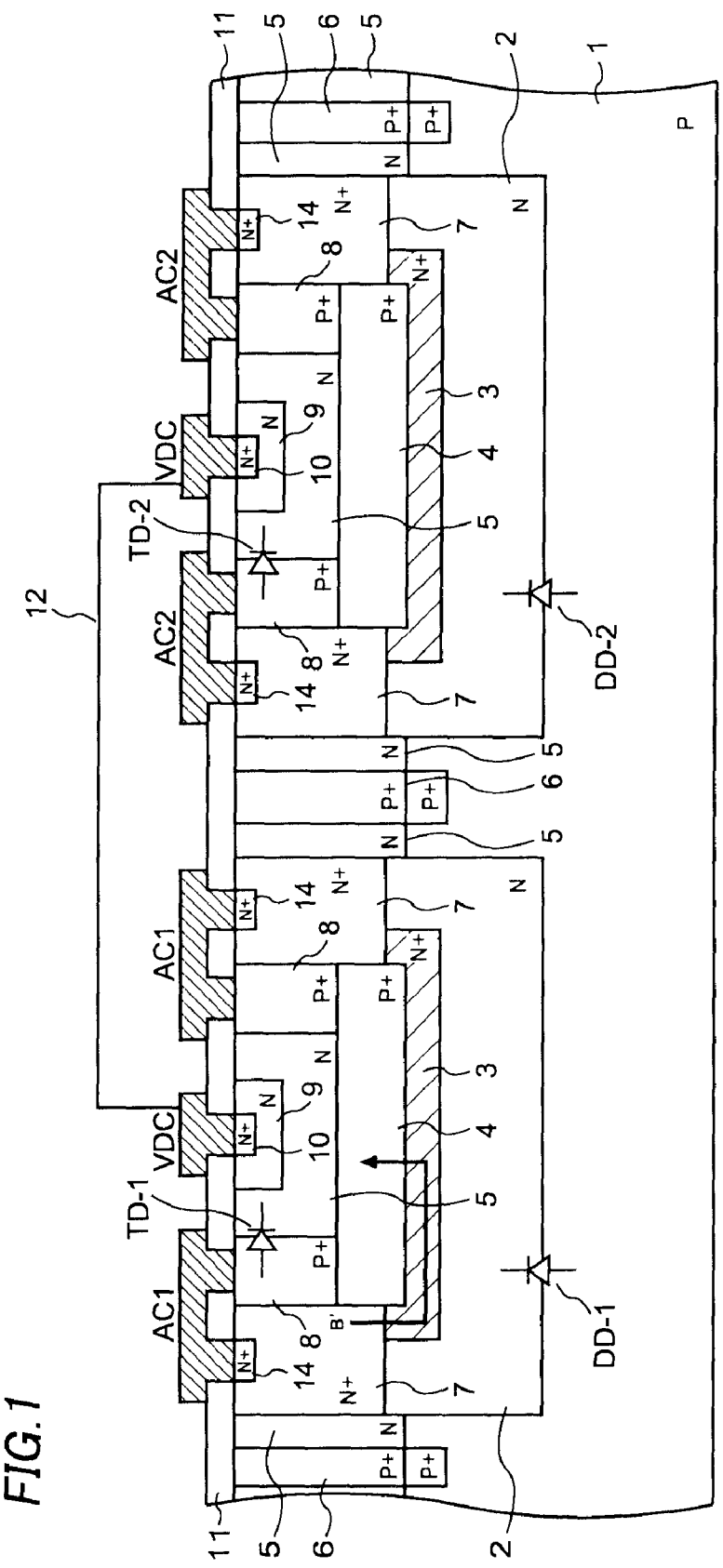
FIG. 1 is a cross-sectional view of a semiconductor device according to an embodiment of this invention.

When FIG. 1 is compared with FIG. 2 that shows the semiconductor device according to the reference example, there are two differences.

One of the differences is that an N+ type buried layer 3, that is higher in impurity concentration than the N type buried layer 2, is formed in the N type buried layer 2. The other of the differences is that there is formed an N+ type conductive layer (N+ type semiconductor layer) 7 that is higher in impurity concentration than the N type epitaxial layer 5 and the N type buried layer 2 and extends from the N+ type contact layer 14 to the N+ type buried layer 3 to make a contact with it or to the vicinity of it. In this case, the N+ type contact layer 14 is formed in a surface of the N+ type conductive layer 7. It is preferable that the N+ type buried layer 3 is formed in a surface of the N type buried layer 2 and touches a bottom portion of the P+ type buried layer 4. Also, it is preferable that the P+ type conductive layer 8 surrounds a portion of the N type epitaxial layer 5 completely, and the N+ type conductive layer 7 surrounds the P+ type conductive layer 8 completely, when looked from the direction perpendicular to the P type semiconductor substrate 1.

It is directed by adopting the structure described above that the on-current of the parasitic PNP transistor depicted by the dashed lines in FIG. 2 is prevented, and a series resistance component of the diode is reduced so that the withstand voltage of the diode is increased and the on-resistance of the diode is reduced.

A method to prevent the on-current of the parasitic PNP transistor from occurring in the case where +140 V is applied to the electrode AC1 and 0 V is applied to the electrode AC2 in the semiconductor device according to the embodiment of this invention is explained hereafter. When +140 V is applied to the electrode AC1, the forward current flows from the P+ type conductive layer 8, that makes the anode of the diode TD-1, toward the N type epitaxial layer 5, that makes the cathode, as in the case of the semiconductor device according to the reference example shown in FIG. 2.

Also as in the case of the semiconductor device according to the reference example shown in FIG. 2, the forward current flows through two paths that are the path indicated by the arrow A and the path indicated by the arrow B in FIG. 2, and the electric potential at the P+ type buried layer 4 becomes higher than the electric potential at the N+ type contact layer 10 to turn on the parasitic NPN transistor that is composed of the emitter made of the N+ type contact layer 10, the base made of the P+ type buried layer 4 and the collector made of the N+ type contact layer 14. In this case, the on-current of the parasitic NPN transistor flows through the two paths that are the path indicated by the arrow A' and the path indicated by the arrow B', also as in the case of the semiconductor device according to the reference example shown in FIG. 2.

However, out of the two paths of the on-current of the parasitic NPN transistor, a structure of the path indicated by the arrow B' in FIG. 1 showing the embodiment of this invention is significantly different from that in FIG. 2 showing the reference example. While the N type buried layer 2 of low impurity concentration makes the path in FIG. 2 showing the reference example, the N+ type buried layer 3 of relatively high impurity concentration makes the path in FIG. 1 showing the embodiment of this invention. To be more specific, while a sheet resistance of the N type buried layer 2 after impurity diffusion is 100Ω/□ or higher, a sheet resistance of the N+ type buried layer 3 is 30Ω/□ or lower. Also, while the high resistance N type epitaxial layer 5 of low impurity concentration is interposed in the path between the N+ type contact layer 14 and the N type buried layer 2 in FIG. 2 showing the reference example, the N+ type conductive layer 7 of relatively high impurity concentration is interposed in the path between the N+ type contact layer 14 and the N+ type buried layer 3 in FIG. 1 showing the embodiment of this invention. The impurity concentration in the N+ type conductive layer 7 is $1 \times 10^{18}/cm^3$ or higher. Therefore, because of the differences between the structure of the semiconductor device according to the embodiment of this invention shown in FIG. 1 and the structure of the semiconductor device according to the reference example shown in FIG. 2, an amount of the voltage drop due to the current flowing through the path indicated by the arrow B' out of the on-current of the parasitic NPN transistor in the embodiment of this invention is significantly different from that in the reference example.

In the reference example, the amount of the voltage drop is large as described above, since the path indicated by the arrow B' is formed of the high resistance N type epitaxial layer 5 and the high resistance N type buried layer 2. As a result, the electric potential at the N type buried layer 2 is reduced from +140 V of the electric potential at AC1 by about 5 V, that is, to about +135 V. In the embodiment of this invention, on the other hand, since the path indicated by the arrow B' is formed of the N+ type conductive layer 7 and the N+ type buried layer 3, both having relatively low resistance, the amount of voltage drop across the path due to the on-current of the parasitic NPN transistor is small. As a result, the electric potential at the N+ type buried layer 3 can be made about +139 V that is higher than +138 V of the electric potential at the P+ type buried layer 4.

In this case, since +139 V of the electric potential at the N+ type buried layer 3, that makes the base of the parasitic PNP transistor, is higher than +138V of the electric potential at the P+ type buried layer 4, that makes the emitter, the parasitic PNP transistor is never turned on and the leakage current flowing from the electrode AC1, that makes the input terminal, to the P type semiconductor substrate 1 can be prevented from occurring. In addition, by adoption of the N+ type conductive layer 7, a wiring resistance between the diode DD-1 and the diode TD-1 and a wiring resistance between the diode DD-2 and the diode TD-2 can be reduced to lower the on-resistance.

Figure 4:
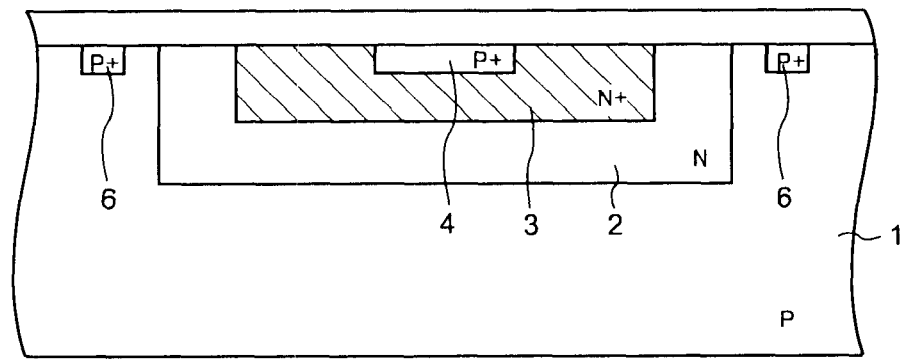
FIG. 4 is a cross-sectional view showing a manufacturing method of the semiconductor device according the embodiment of this invention.
Figure 5:
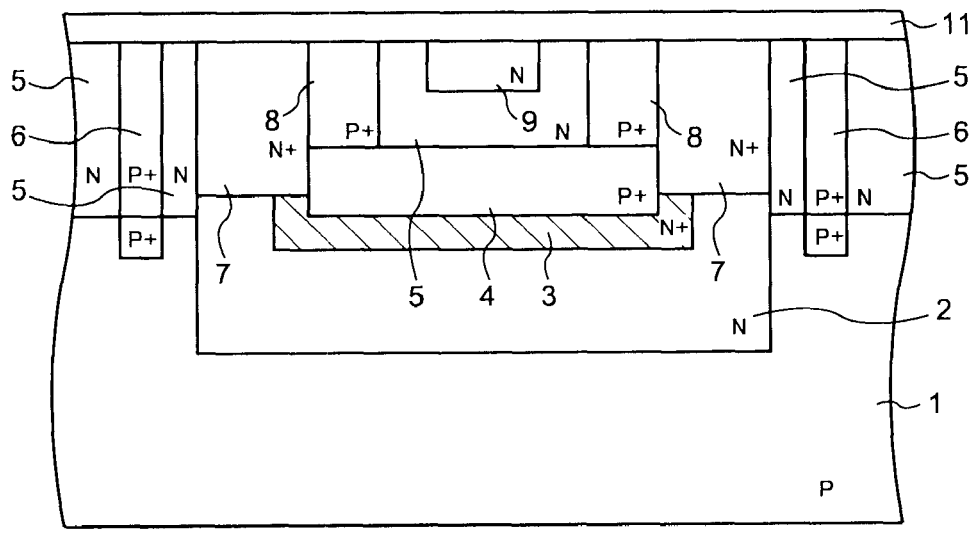
FIG. 5 is a cross-sectional view showing the manufacturing method of the semiconductor device according the embodiment of this invention.
Figure 6:
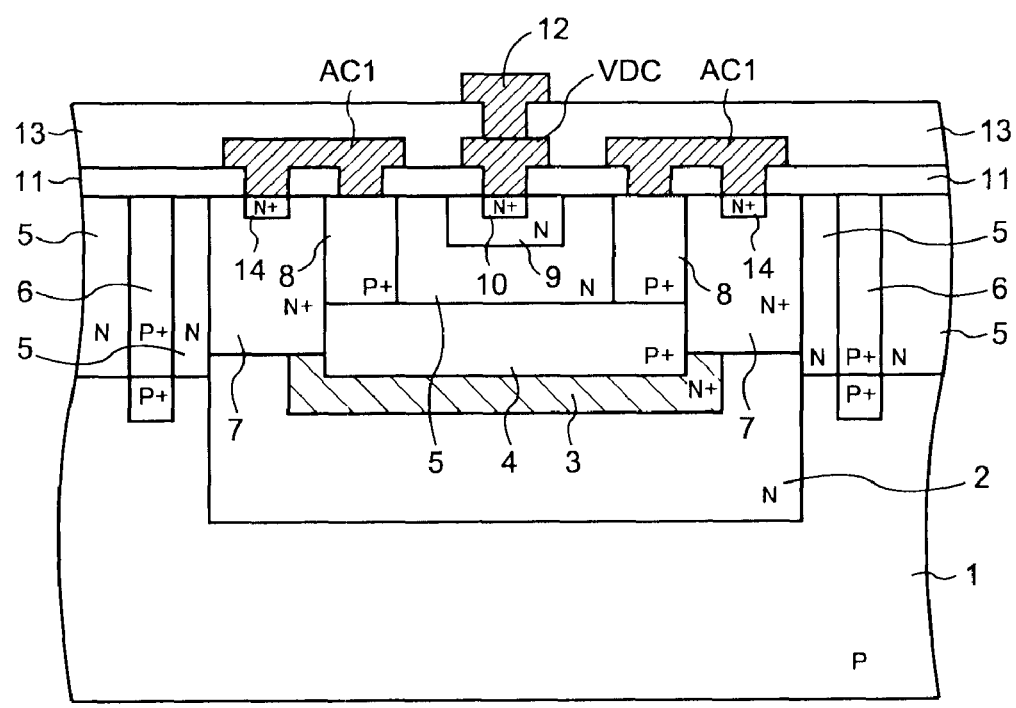
FIG. 6 is a cross-sectional view showing the manufacturing method of the semiconductor device according the embodiment of this invention.

A manufacturing method of the semiconductor device according to the embodiment of this invention will be briefly explained referring to FIG. 4-FIG. 6. Only one of the two serially-connected pairs of diodes shown in FIG. 1 is shown in FIGS. 4-6 and will be explained. First, as shown in FIG. 4, the P type semiconductor substrate 1 made of P type single crystalline semiconductor is provided. An SOG (Spin-On Glass) film including antimony (Sb) is applied on the P type semiconductor substrate 1, and the N+ type buried layer 3 is formed by diffusing antimony from the SOG film into a predetermined region of the P type semiconductor substrate 1 using a silicon oxide film or the like as a mask.

Next, phosphorus (P) ions are implanted into the P type semiconductor substrate 1 through a resist mask that has an opening larger than an opening in the mask of the silicon oxide film or the like. After that, thermal diffusion process is performed at high temperature for a long period of time so that the implanted phosphorus ions are driven into the P type semiconductor substrate 1 deeper than the N+ type buried layer 3 to form the N type buried layer 2. The N type buried layer 2 of low impurity concentration is formed to increase a breakdown voltage of a PN junction with the P type semiconductor substrate 1.

Next, boron (B) ions or the like are implanted into the N+ type buried layer 3 through a resist mask. At the same time, boron ions or the like are implanted through the resist mask into a region where the P+ type isolation layer 6 is to be formed. The implanted boron ions or the like are thereafter driven into the N+ type buried layer 3 and the P type semiconductor substrate 1 at high temperature. After removing the silicon oxide film or the like, the N type epitaxial layer 5 made of N type single crystalline semiconductor is deposited by epitaxial growth over the entire surface of the P type semiconductor substrate 1 through predetermined process steps, as shown in FIG. 5.

Next, a high dose of phosphorus ions are implanted through a resist mask having openings at predetermined locations on a thin silicon oxide film formed on a surface of the N type epitaxial layer 5. Since the implanted phosphorus ions are to form the low resistance N+ type conductive layer 7 by later high temperature diffusion, the dose of phosphorus ions at the implantation process step is as high as $8 \times 10^{15}/cm^2$. Next, phosphorus ions are implanted through a resist mask to form the N type well layer 9 in a predetermined region.

Next, heat treatment is performed on the whole silicon substrate to drive-in the implanted phosphorus impurities and to form a silicon oxide film. Next, the P+ type isolation layer 6 and the P+ type conductive layer 8 are formed by introducing boron or the like through openings formed in predetermined regions in the silicon oxide film through a predetermined photo-etching process and subsequent high temperature heat treatment. In this case, the P+ type buried layer 4 diffuses upward into the N type epitaxial layer 5 and becomes contiguous to the P+ type conductive layer 8.

Also, the N+ type conductive layer 7 diffuses into the N type epitaxial layer 5, and becomes contiguous to the N type buried layer 2 or to the N+ type buried layer 3 that has diffused upward. It is preferable that it becomes contiguous to the N+ type buried layer 3. The boron ions implanted in the P type semiconductor substrate 1 diffuse upward while boron or the like introduced in the surface of the N type epitaxial layer 5 diffuses downward so that they meet each other midway in the N type epitaxial layer 5 to form the contiguous P+ type isolation layer 6.

Next, after forming openings through a predetermined photo-etching process at predetermined locations in a silicon oxide film covering entire surface of the semiconductor substrate 1, phosphorus is introduced into the N type well layer 9 and the N+ type conductive layer 7 using phosphorus oxychloride or the like in a high temperature furnace, as shown in FIG. 6. The introduced phosphorus forms the N+ type contact layer 10 and the N+ type contact layer 14. Next, after forming an insulation film 11 by CVD method or the like, contact holes are formed through a predetermined photo-etching process.

Next, after sputtering aluminum (Al) alloy or the like, the electrode AC1 and the like are formed through a predetermined photo-etching process. Next, an interlayer insulation film 13 is formed, and the VDC wiring 12 connecting with the electrode VDC is formed by providing an opening in the interlayer insulation film 13. Finally, the desired semiconductor device is completed by forming a protection film (not shown).

What is claimed is:

1. A semiconductor device comprising:
    a semiconductor substrate of a first general conductivity type;
    an epitaxial layer of a second general conductivity type formed on the semiconductor substrate;
    a first buried layer of the second general conductivity type buried in the semiconductor substrate;
    a second buried layer of the second general conductivity type buried in the first buried layer and having a higher impurity concentration than the first buried layer;
    a third buried layer of the first general conductivity type buried in the second buried layer and the epitaxial layer;
    a first conductive layer of the first general conductivity type formed in a first portion of the epitaxial layer so as to be on a peripheral portion of the third buried layer; and
    an isolation layer of the first general conductivity type formed in the epitaxial layer so as to isolate the first portion of the epitaxial layer and the third buried layer from other portions of the epitaxial layer,
    wherein the semiconductor substrate and the first buried layer are configured to operate as a first diode so that the semiconductor substrate works as an anode and the first buried layer works as a cathode,
    the first conductivity layer and the epitaxial layer are configured to operate as a second diode so that the first conductive layer works as an anode and the epitaxial layer works as a cathode, and
    the first diode and the second diode are connected serially.

2. The semiconductor device of claim 1, wherein the second buried layer physically in contact with a bottom of the third buried layer.

3. The semiconductor device of claim 1, further comprising a second conductive layer of the second general conductivity type formed in the first portion of the epitaxial layer and having a higher impurity concentration than the epitaxial layer, a bottom of the second conductive layer touching the second buried layer or extending to a vicinity of the second buried layer.

4. The semiconductor device of claim 3, further comprising a first contact layer of the second general conductivity type formed in a surface portion of the first portion of the epitaxial layer adjacent the first conductive layer, a second contact layer of the second general conductivity type formed in a surface portion of the second conductive layer, a first electrode electrically connected to the first conductive layer and the second contact layer, and a second electrode electrically connected to the first contact layer.

5. The semiconductor device of claim 3, wherein the second conductive layer surrounds the first conductive layer.

6. The semiconductor device of claim 4, further comprising another first diode that is formed in a second portion of the epitaxial layer in the same way as the first diode and another second diode that is formed in the second portion of the epitaxial layer in the same way as the second diode, the another first diode and the another second diode being connected serially, the isolation layer isolating the first portion of the epitaxial layer from the second portion of the epitaxial layer, and the second electrode of the first and second diodes and the second electrode of the another first and second diodes are electrically connected.

7. The semiconductor device of claim 6, wherein the first and second diodes and the another first and second diodes are formed in the same semiconductor substrate so as to form a bridge circuit.

8. The semiconductor device of claim 1, wherein the first conductive layer surrounds a portion of the first portion of the epitaxial layer that is on the third buried layer.

* * * * *